(12) United States Patent
Chen et al.

(10) Patent No.: US 11,527,605 B2
(45) Date of Patent: Dec. 13, 2022

(54) METHOD FOR FABRICATING METAL-OXIDE-METAL CAPACITOR

(71) Applicant: UNITED MICROELECTRONICS CORP., Hsinchu (TW)

(72) Inventors: Shu-Ji Chen, Singapore (SG); Jing Feng, Singapore (SG); Xiao-Hong Jiang, Singapore (SG); Ching-Hwa Tey, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/364,935

(22) Filed: Jul. 1, 2021

(65) Prior Publication Data

US 2022/0367609 A1 Nov. 17, 2022

(30) Foreign Application Priority Data

May 13, 2021 (CN) .......................... 202110520984.6

(51) Int. Cl.
*H01L 49/02* (2006.01)
*H01L 21/66* (2006.01)
(Continued)

(52) U.S. Cl.
CPC .......... *H01L 28/91* (2013.01); *G01R 27/2605* (2013.01); *G01R 31/2639* (2013.01); *H01L 21/67253* (2013.01); *H01L 22/12* (2013.01); *H01L 22/14* (2013.01); *H01L 22/20* (2013.01); *H01L 23/5223* (2013.01); *H01L 23/5226* (2013.01); *H01L 28/40* (2013.01); *H01L 28/92* (2013.01)

(58) Field of Classification Search
CPC . H01L 28/87–88; H01L 28/91; H01L 23/642; H01L 23/5222; H01L 23/52223; H01L 23/5226; H01L 23/5283; H01L 27/0805; H01L 21/8221; H01L 21/67253; H01L 2027/11883–11888; H01L 22/12–20; H01L 23/5223; H01L 28/40–92; G01R 27/2605; G01R 31/2639
See application file for complete search history.

(56) References Cited

U.S. PATENT DOCUMENTS 7,964,422 B1 6/2011 Yee
8,019,457 B2 9/2011 Ma
(Continued)

*Primary Examiner* — Jose R Diaz
(74) *Attorney, Agent, or Firm* — WPAT, PC

(57) ABSTRACT

A method for fabricating a MOMCAP includes steps as follows: An Nth metal layer is formed on a substrate according to an Nth expected capacitance value of the Nth metal layer. An Nth capacitance error value between an Nth actual capacitance value of the Nth metal layer and the Nth expected capacitance value is calculated. An N+1th expected capacitance value of an N+1th metal layer is adjusted to form an N+1th actual capacitance value according to the Nth capacitance error value, and the N+1th metal layer with an N+1th actual capacitance value is formed on the Nth metal layer according to the adjusted N+1th expected capacitance value, to make the sum of the Nth actual capacitance value and the N+1th actual capacitance value equal to the sum of the Nth expected capacitance value and the N+1th expected capacitance value. N is an integer greater than 1.

8 Claims, 9 Drawing Sheets

(51) Int. Cl.
    *H01L 23/522*    (2006.01)
    *H01L 21/67*     (2006.01)
    *G01R 27/26*    (2006.01)
    *G01R 31/26*    (2020.01)

(56) References Cited

U.S. PATENT DOCUMENTS

| | | | |
|---|---|---|---|
| 10,269,893 B2 * | 4/2019 | Cui | G01R 27/2605 |
| 11,024,704 B1 * | 6/2021 | Chang | H01L 28/56 |

\* cited by examiner

METHOD FOR FABRICATING METAL-OXIDE-METAL CAPACITOR

This application claims the benefit of People's Republic of China application Serial No. 202110520984.6 filed May 13, 2021, the subject matter of which is incorporated herein by reference.

BACKGROUND

Technical Field

The disclosure relates to a method for fabricating a semiconductor device, and more particularly to a method for fabricating a metal-oxide-metal capacitor (MOMCAP).

Description of Background

In general, the process for manufacturing an integrated circuit (IC) and a printed circuit board (PCB) includes the forming of passive components, such as capacitors. For example, two types of capacitor structures, such as metal-insulator-metal (MIM) capacitors and MOMCAPs, have been commonly used in the prior art.

A typical MIM capacitor includes a bottom plate and an upper plate made of conductive materials, and an insulating layer disposed between these two. A MOMCAP includes a three-dimensional (3D) structure formed by a plurality of metal layers vertically stacked, wherein each of the metal layers has finger electrodes parallel to each other; and the finger electrodes on each of the metal layers are electrically connected by the via plugs passing through the interlayer dielectric (ILD).

Generally, the MIM capacitor has smaller parasitic capacitance; however the manufacturing cost of the MIM is relatively high, because it requires additional photomask during the manufacturing process. Instead, the manufacturing cost of the MOM is relatively low, since the metal layer of the MOM can be formed by the existing metal manufacturing process. Moreover, because the MOMCAP has a higher unit capacitance density based upon its multilayer 3D structure, with the reduction of semiconductor critical dimensions and the gradually increased requirements of the component efficiency, it has become one of the most common components used in the circuit design for manufacturing ICs and PCBs. For example, the MOMCAP is usually used in a radio frequency integrated circuit (RFIC) to filter the noise, or used to serve as a load component in a digital electronic product.

However, in the manufacturing process of the MOMCAP, there are a variety of manufacturing process parameters, such as the thickness of each metal layer, the distance between the finger electrodes, and the length variation of the finger electrodes, which may affect the overall capacitance of the MOMCAP, and result in a decrease in the yield of the manufacturing process. With the increase in the number of metal layers and the shrinking of the critical dimensions, the adverse effects on the overall capacitance of the MOMCAP may get worse, and the impact on the yield of the manufacturing process may become more obvious.

Therefore, there is a need of providing an advanced method for fabricating a MOM to obviate the drawbacks encountered from the prior art.

SUMMARY

One aspect of the present disclosure is to provide a method for fabricating a MOMCAP, wherein the method includes steps as follows: Firstly, an Nth metal layer is formed on a substrate according to an Nth expected capacitance value of the Nth metal layer. An Nth capacitance error value between an Nth actual capacitance value of the Nth metal layer and the Nth expected capacitance value is then calculated. An N+1th expected capacitance value of an N+1th metal layer is adjusted to form an adjusted N+1th expected capacitance value according to the Nth capacitance error value. The N+1th metal layer with an N+1th actual capacitance value is formed on the Nth metal layer according to the adjusted N+1th expected capacitance value, so as to make the sum of the Nth actual capacitance value and the N+1th actual capacitance value equal to the sum of the Nth expected capacitance value and the N+1th expected capacitance value. Wherein, N is an integer greater than 1.

In accordance with the aforementioned embodiments of the present disclosure, a method for fabricating a MOMCAP is provided; wherein the method includes steps of forming at least N+1 metal layers on a substrate, where N is an integer greater than 1. Among the process of manufacturing these metal layers, at least one process parameter for forming an Nth metal layer, such as an Nth capacitance error value, an Nth thickness error value and/or an Nth pitch error value of the Nth metal layer, is estimated, and the process parameters of an N+1th metal layer subsequently being formed on the Nth metal layer can be adjusted according to the at least one estimated parameter to make the sum of an Nth actual capacitance value of the Nth metal layer and the N+1th actual capacitance value of the N+1th metal layer equal to the sum of an Nth expected capacitance value of the Nth metal layer and an N+1th expected capacitance value of the N+1th metal layer. As a result, the variation of the overall capacitance of the MOMCAP can be greatly reduced, and the yield of the device can be improved.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1:
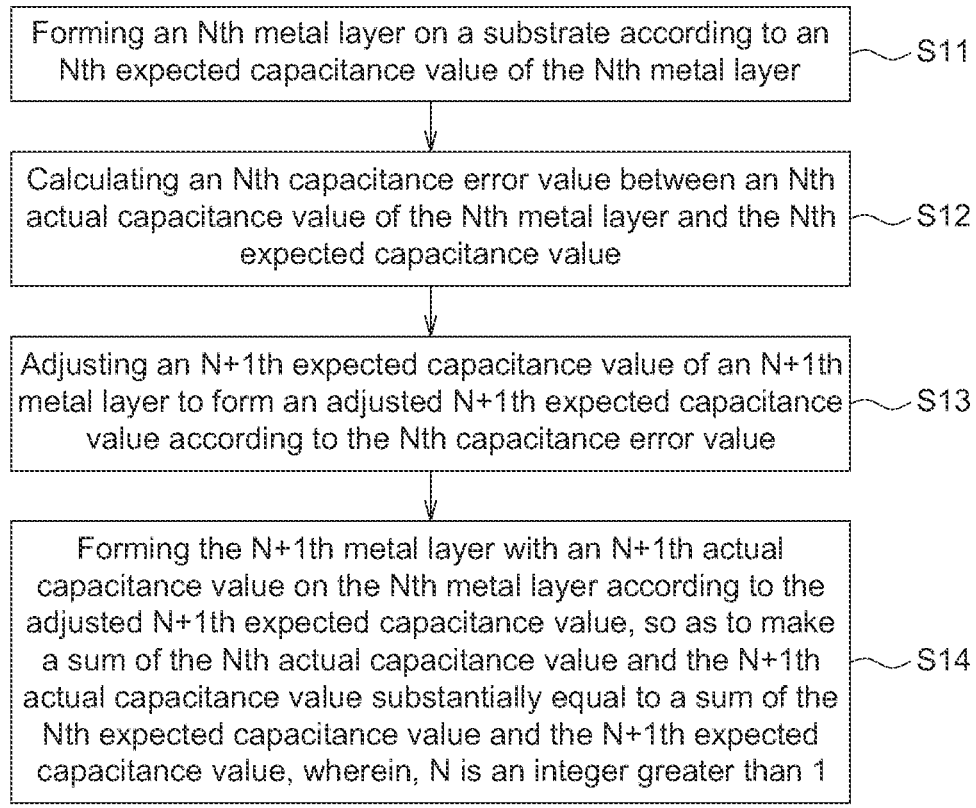
FIG. 1 is a processing flowchart illustrating a method for fabricating a MOMCAP, in accordance with one embodiment of the present disclosure.

The embodiments as illustrated below provide a method for fabricating a MOMCAP to reduce the variation degree of the overall capacitance value of the MOMCAP and improve the yield of the manufacturing process for fabricating the same. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

Figure 2A:
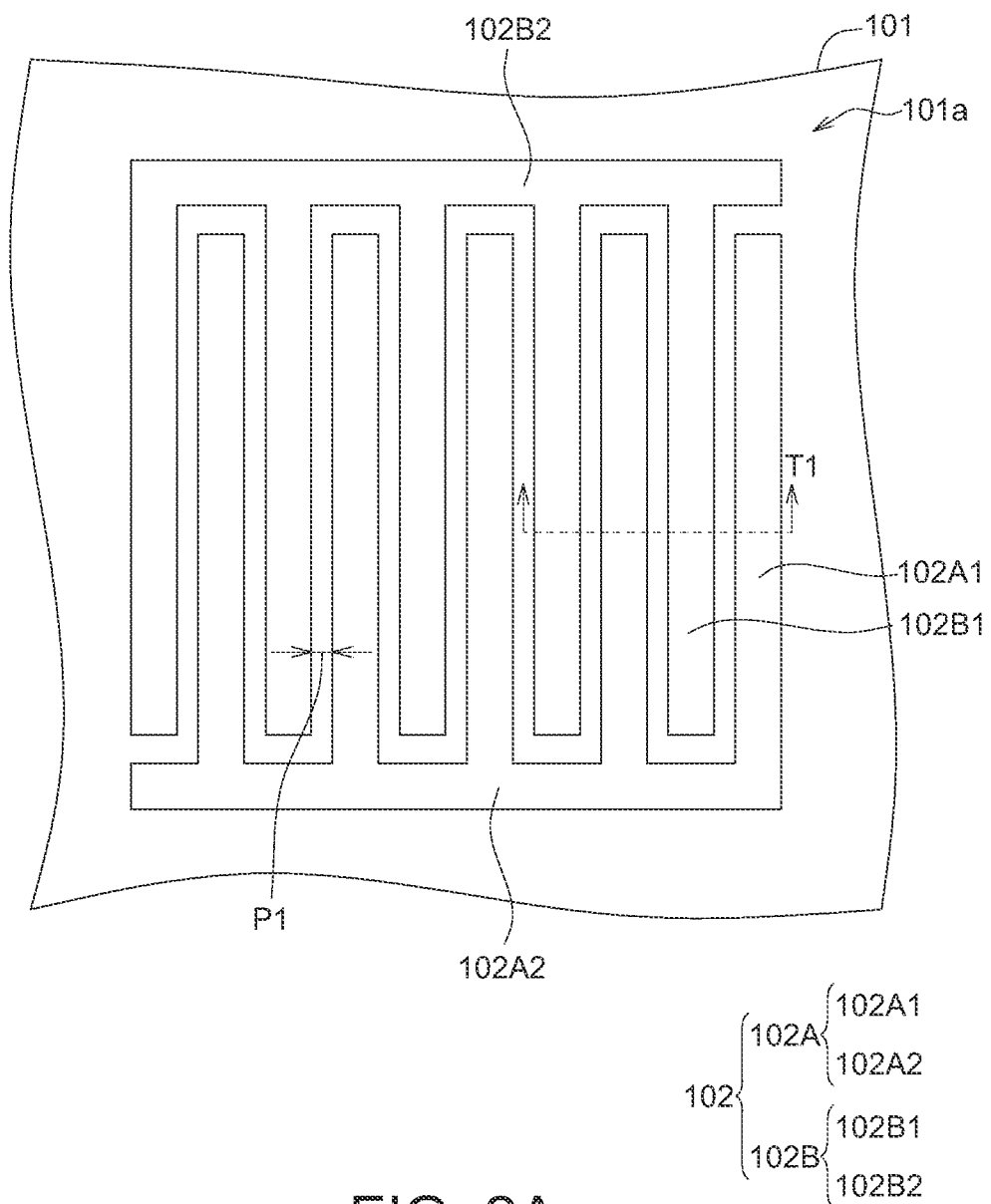
FIG. 2A is a top view illustrating a part of the processing structure after an Nth metal layer is formed on a substrate according to the step S11 as described in of FIG. 1.
Figure 2B:
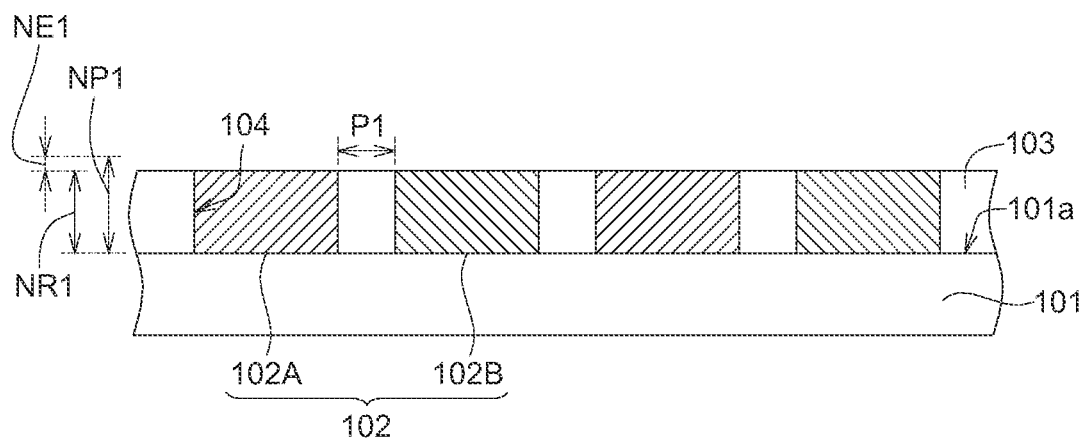
FIG. 2B is a cross-sectional view illustrating a part of the processing structure taken along the cutting line T1 as depicted in FIG. 2A.
Figure 2C:
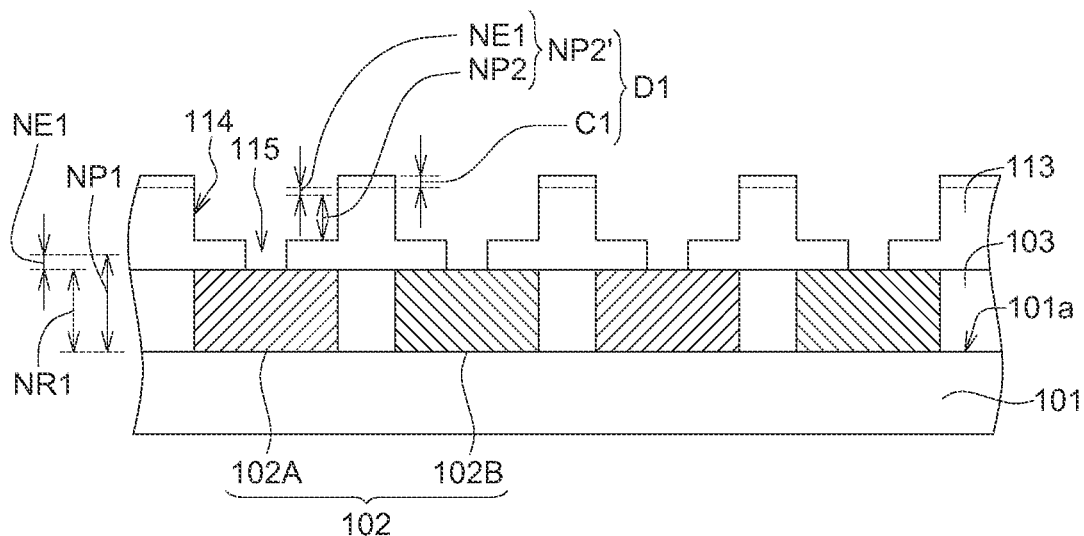
FIGS. 2C and 2D are cross-sectional views illustrating part of the processing structures after an N+1th metal layer is formed over the Nth metal layer according to the steps S13 and S14 as described in FIG. 1.
Figure 2D:
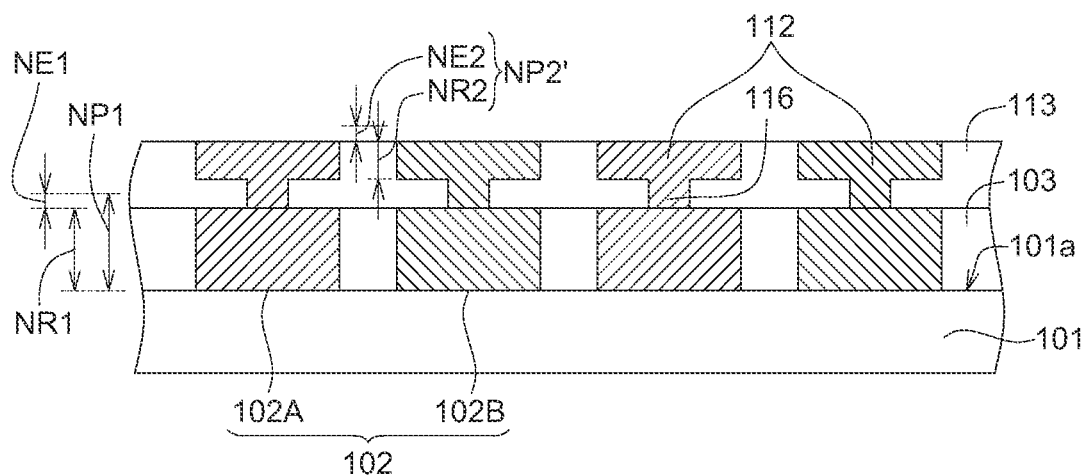
Figure 2E:
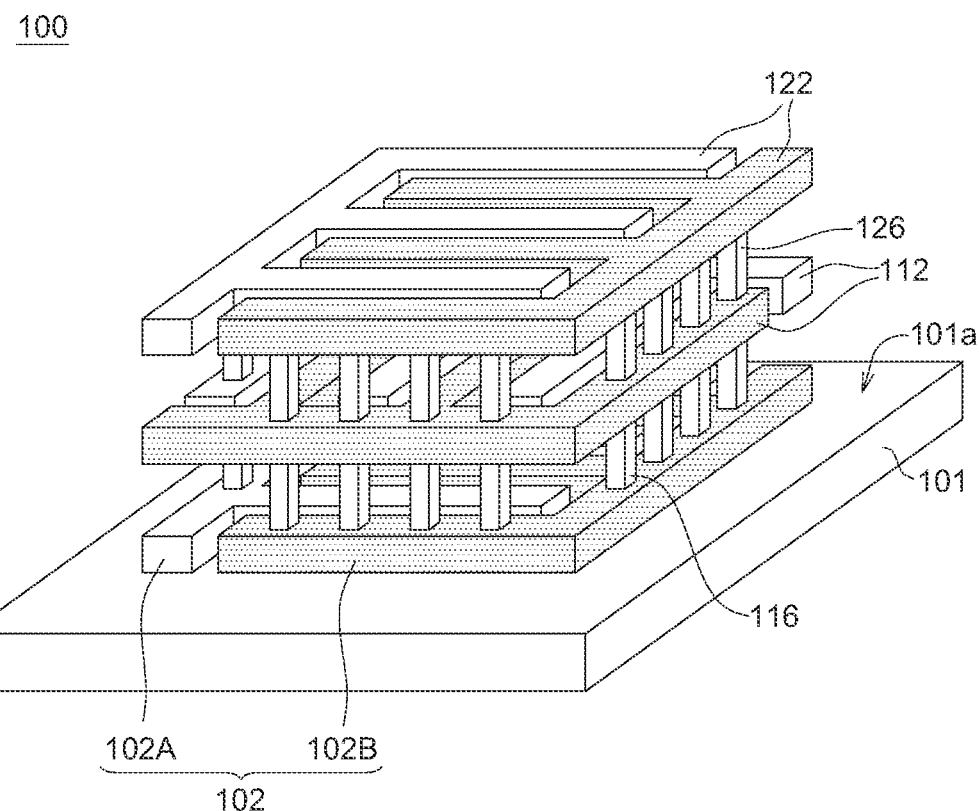
FIG. 2E is a cross-sectional view illustrating a MOMCAP, in accordance with one embodiment of the present disclosure.

FIG. 1 is a processing flowchart illustrating a method for fabricating a MOMCAP 100, in accordance with one embodiment of the present disclosure, wherein the MOMCAP 100 at least includes an Nth metal layer 102, an N+1th metal layer 112, and an N+2th metal layer 122 (as shown in FIG. 2E). The method for fabricating the MOMCAP 100 includes steps as follows: Firstly, referring to the step S11, the Nth metal layer 102 is formed on a substrate 101 according to an Nth expected capacitance value of the Nth metal layer 102.

FIG. 2A is a top view illustrating a part of the processing structure after the Nth metal layer 102 is formed on the substrate 101 according to the step S11 as described in FIG. 1; FIG. 2B is a cross-sectional view illustrating a part of the processing structure taken along the cutting line T1 as depicted in FIG. 2A.

In some embodiments of the present disclosure, the substrate 101 can be made of a semiconductor material, such as silicon (Si), germanium (Ge), or made of a compound semiconductor material, such as gallium arsenide (GaAs). However, in some other embodiments, the substrate 101 can be a silicon-on-insulator (SOI) substrate. In the present embodiment, the substrate 101 is preferably a silicon substrate, such as a silicon wafer.

In some embodiments of the present disclosure, the Nth metal layer 102 can be the first patterned metal circuit layer (M1) formed on the surface 101a of the substrate 101. However, in other embodiments of the present disclosure, there includes at least one patterned metal circuit layer (not shown) formed on the surface 101a of the substrate 101, before the Nth metal layer 102 is formed thereon. In the present embodiment, the Nth metal layer 102 may be a second patterned metal circuit layer (M2) formed on the surface 101a of the substrate 101.

The forming of the Nth metal layer 102 includes steps as follows: An interlayer dielectric (ILD) layer 103 is firstly formed on the surface 101a of the substrate 101 to cover at least one or more patterned metal layers (not shown). A plurality of recess 104 are formed in the ILD layer 103, and a metal material, such as copper, is formed on the ILD layer 103 by a metal deposition process to fill the recess 104. Next, a planarization process, such as a chemical-mechanical polishing (CMP) process, is performed to remove a portion of the metal material located above the ILD layer 103 to form the Nth metal layer 102 in the recess 104.

In the present embodiment, the Nth metal layer 102 includes a first interdigital structure 102A and a second interdigital structure 102B formed on the same plane and crossing with each other. In detail, the first interdigital structure 102A includes a plurality of fingers 102A1 and a bus line 102A2 connecting the fingers 102A1; the second interdigital structure 102B includes a plurality of fingers 102B1 and a bus line 102B2 connecting the finger strips 102B1. One of the fingers 102A1 is sandwiched between two adjacent fingers 102B1. There is a pitch P1 between two adjacent fingers 102A1 and 102B1 (i.e., the distance between the first interdigital structure 102A and the second interdigital structure 102B).

Next, referring to step S12 as described in FIG. 1: An Nth capacitance error value of the Nth metal layer 102 between an Nth actual capacitance value and the Nth expected capacitance value of the Nth metal layer 102 is calculated. In some embodiments of the present disclosure, the Nth expected capacitance value of the Nth metal layer 102 is a predetermined value; the Nth actual capacitance value of the Nth metal layer 102 can be obtained through an actual measurement; and the Nth capacitance error value of the Nth metal layer 102 can be obtained by subtracting the Nth expected capacitance value from the measured Nth actual capacitance value of the Nth metal layer 102.

In the present embodiment, the Nth actual capacitance value of the Nth metal layer 102 can be estimated according to the expected capacitance values of the Nth metal layer 102, the N+1th metal layer 112 and the N+2th metal layer 122 of the MOMCAP 100 and the Nth actual thickness NR1 of the Nth metal layer 102 that is actually measured according to the steps as depicted in FIGS. 2A and 2B. And the Nth capacitance error value of the Nth metal layer 102 can be obtained by subtracting the Nth expected capacitance value of the Nth metal layer 102 from the estimated Nth actual capacitance value.

Figure 3:
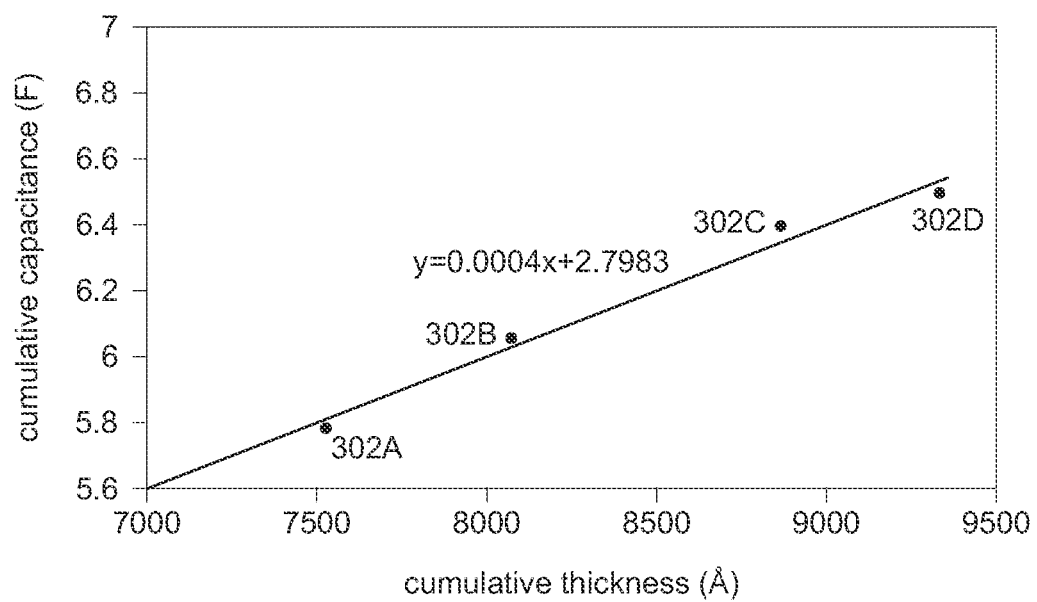
FIG. 3 is a diagram illustrating the relationship between the cumulative thickness and the cumulative capacitance of each metal layers constituting a MOMCAP, in accordance with one embodiment of the present disclosure.

FIG. 3 is a diagram illustrating the relationship between the cumulative thickness and the cumulative capacitance of each metal layers constituting a MOMCAP, in accordance with one embodiment of the present disclosure. For example, the MOMCAP 300 has multiple metal layers (e.g., the MOMCAP 300 has four stacked metal layers metal layers 302A-302D).

It can be seen from FIG. 3 that the cumulative thickness of any one of the metal layers 302A-302D constituting the MOMCAP 300 (e.g., the metal layer 302C) and the metal layers stacked thereunder (i.e., the metal layers 302A and 302B) has a positive linear relationship with the cumulative capacitance of the metal layers (i.e., the three metal layers 302A, 302B, and 302C). In other words, the cumulative sum of the individual thicknesses of the first to Nth metal layers stacked on the substrate 101 (the cumulative thickness) and the cumulative sum of the individual expected capacitance values of the first to Nth metal layers (the cumulative capacitance) can form a linear relationship function. For example, in the present embodiment, the relationship between the cumulative thickness (Å) and the cumulative capacitance (F) can be obtained by a regression analysis, and the linear relationship function obtained by the regression analysis can be expressed as the equation of y=0.0004x+27983.

Because the expected capacitance values of the metal layers (such as, the metal layers 302A-302D) constituting the MOMCAP 300 can be predetermined based on the element design of the MOMCAP 300; and it is known that the predetermined capacitance value of each metal layer is proportional to the expected thickness of the individual metal layer. The Nth actual capacitance value of the Nth metal layer 102 of the MOMCAP 300 can be estimated according to the actually measured Nth actual thickness NR1 of the Nth metal layer 102, the linear relationship function and the slope as described in FIG. 3. And the Nth capacitance error value of the Nth metal layer 102 can be obtained by subtracting the Nth expected capacitance value of the Nth metal layer 102 from the estimated Nth actual capacitance value. Wherein, the Nth capacitance error value of the Nth metal layer 102 can be a positive value or a negative value.

Then, referring to step S13 as described in FIG. 1: An N+1th expected capacitance value of the N+1th layer 112 can be adjusted according to the Nth capacitance error value. According to the above calculation, the ratio of the Nth capacitance error value to an Nth thickness error value NE1 of the Nth metal layer 102 may be equal to the ratio of the sum of the expected capacitance values to the sum of the expected thicknesses of all the metal layers constituting the MOMCAP 100. Wherein the Nth thickness error value NE1 is equal to the Nth actual thickness NR1 minus the Nth expected thickness NP1 (NE1=NP1−NR1). In other words, the Nth capacitance error value of the Nth metal layer 102 resulted from the fabrication of the Nth metal layer 102 can be compensated by adjusting an N+1th expected thickness NP2 of the N+1th metal layer 112. That is, the N+1th expected thickness NP2 of the N+1th layer can be adjusted according to the Nth thickness error value NE1 of the Nth metal layer 102, so as to achieve the purpose of adjusting the N+1th expected capacitance value of the N+1th layer 112 in step S13.

In the present embodiment, the adjustment of the N+1th expected capacitance value of the N+1th metal layer 112 is to add the Nth thickness error value NE1 of the Nth metal layer 102 to the N+1 expected thickness NP2 of the N+1th metal layer 112 (NE1+NP2). After the adjustment, the adjusted N+1th expected thickness NP2' of the N+1th metal layer 112 is the sum of the N+1th expected thickness NP2 of the N+1th metal layer 112 and the Nth thickness error value NE1 of the Nth metal layer 102 (NP2'=NP2+NE1).

Subsequently, referring to step S14 as described in FIG. 1, the N+1th metal layer 112 with the N+1th actual capacitance value is formed on the Nth metal layer 102 according to the adjusted N+1th expected capacitance value of the N+1th metal layer 112 to make the sum of the Nth actual capacitance value of the Nth metal layer 102 and the N+1th actual capacitance value of the N+1th metal layer 112 is equal to the sum of the Nth expected capacitance value of the Nth metal layer 102 and the N+1th expected capacitance value of the N+1th metal layer 112.

In the present embodiment, the N+1th metal layer 112 (having the N+1th actual capacitance value) that meets the above conditions can be implemented by forming a metal layer with an N+1th actual thickness NR2 on the Nth metal layer 102 according to the adjusted N+1th expected thickness NP2', and to make the sum of the Nth actual thickness NR1 of the Nth metal layer 102 and the N+1th actual thickness NR2 of the N+1th metal layer 112 equal to the sum of the Nth expected thickness NP1 of the Nth metal layer 102 and the N+1th expected thickness NP2 of the N+1th metal layer 112.

FIGS. 2C and 2D are cross-sectional views illustrating part of the processing structures after the N+1th metal layer 112 is formed over the Nth metal layer 102 according to the steps S13 and S14 as described in FIG. 1. The forming of the N+1th metal layer 112 includes steps of forming an ILD layer 113 on the Nth metal layer 102 to cover the Nth metal layer 102, and forming a plurality of recesses 114 in the ILD layer 113 by an etching process.

In some embodiments of the present disclosure, before or after the recesses 114 is formed, another etching process may be used to form a plurality of vias 115 in the ILD layer 113 in communication with the recesses 114 to expose portions of the Nth metal layer 102 through the recess 114 and the vias 115. As shown in FIG. 2C, in the present embodiment, each of the vias 115 is formed at the bottom of one of the recesses 114. By adjusting the depth of the etching process, the target depth D1 of the recesses 114 is substantially equal to the sum of the Nth thickness error value NE1, the N+1th expected thickness NP2 and the tolerance thickness C1 of the ILD layer 113 that may be removed by the subsequent planarization process (D1=C1+NE1+NP2). In other words, the depth of the recesses 114, after the target depth D1 of the recesses 114 subtracting the tolerance thickness C1 of the ILD layer 113 that may be removed by the subsequent planarization process, (D1−C) is substantially equal to the adjusted N+1th expected thickness NP2' of the N+1th layer of 112 (which can be expressed as (D1−C1)=(NE1+NP2)=NP2').

After that, a metal material, such as copper, is formed on the ILD layer 113 by a metal deposition process to fill the recesses 114 and the vias 115. Then, a planarization process (such as, a CMP process) is performed to control the depth of chemical mechanical polishing, and remove a portion of the metal material located above the ILD layer 113 (including moving the portion of the ILD layer 113 with the tolerance thickness C1 and the portion of metal material corresponding to the tolerance thickness C1), so as to make the N+1th metal layer 112 formed in the recesses 114 has a thickness equal to a sum of the Nth thickness error value NE1 of the Nth metal layer 102 and the N+1th expected thickness NP2 (NE1+NP2) of the N+1 metal layer 112; and to form a contact plug 116 respectively in each of the vias 115 to electrically connect the Nth metal layer 102 and the N+1th metal layer 112 (as shown in FIG. 2D).

Subsequently, the N+2th metal layer 122 is formed on the N+1th metal layer 112 by repeating the steps S13 to S14 as described in FIG. 1, to make the N+2th metal layer 122 electrically connected to the N+1th metal layer 112 through at least one contact plug 126. After performing a plurality of downstream-production processes (not shown), the MOMCAP 100 as shown in FIG. 2E can be formed. Wherein, the sum of the actual capacitance values of the Nth metal layer 102, the N+1th metal layer 112 and the N+2th metal layer 122 is substantially equal to the sum of the expected capacitance values of the Nth metal layer 102, the N+1th metal layer 112 and the N+2th metal layer 122 of the MOMCAP 100.

It should be appreciated that the number of metal layers of the MOMCAP 100 is an integer greater than or equal to two (i.e., N is greater than 1). Although there are merely three metal layers, such as the Nth metal layer 102, the N+1th metal layer 112 and the N+2th metal layer 122 shown in FIG. 2E, but the number of metal layers involved in the MOMCAP 100 is not Limited to this regard. In other embodiments, the MOMCAP 100 may include more stacked metal layers.

Among the above method, during the process for fabricating the underlying metal layer of the MOMCAP 100, the capacitance error value, the thickness error value or the pitch error value of the underlying metal layers previously formed on the substrate are estimated; and the manufacturing parameters of the upper metal layer subsequently being formed on the underlying metal layers can be adjusted according to these estimated error values, so that the cumulative sum of the actual capacitance values of all the metal layers can be substantially equal to the sum of the cumulative expected capacitance values of all the metal layers. As a result, the variation degree of the overall capacitance value of the MOMCAP 100 can be greatly reduced, and the yield of the device can be improved.

Figure 4A:
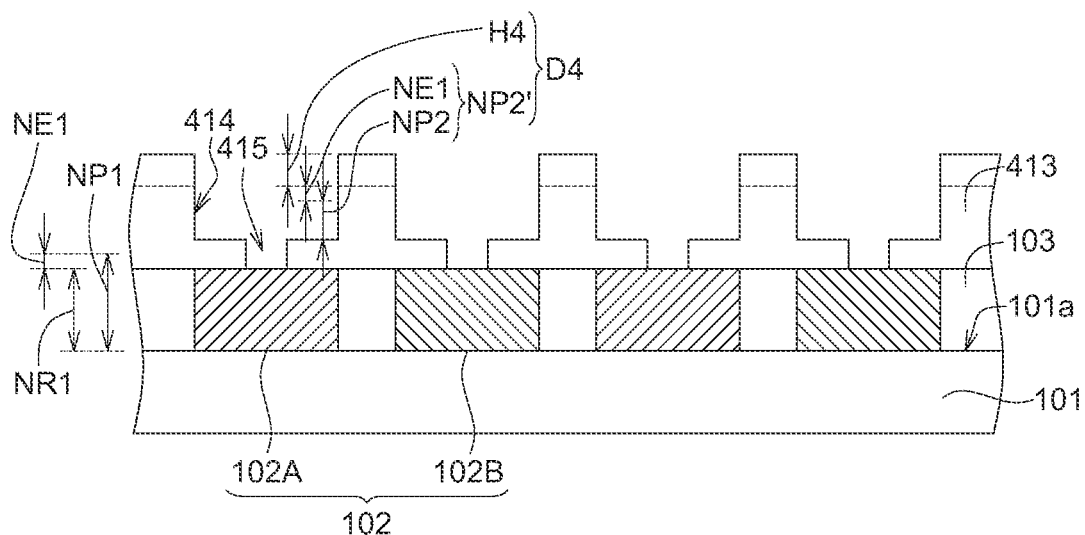
FIGS. 4A and 4B are cross-sectional views illustrating part of the processing structures after an N+1th metal layer is formed over the Nth metal layer by applying the steps S13 and S14 as described in FIG. 1, in accordance with another embodiment of the present disclosure.
Figure 4B:
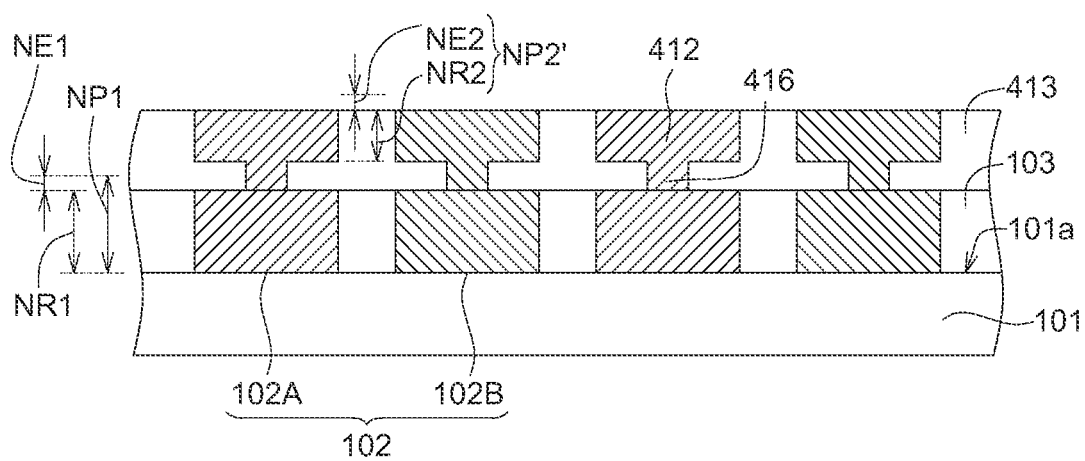

FIGS. 4A and 4B are cross-sectional views illustrating part of the processing structures after an N+1th metal layer 112 is formed over the Nth metal layer 102 by applying the steps S13 and S14 as described in FIG. 1, in accordance with another embodiment of the present disclosure. In the present embodiment, the steps of forming the N+1th metal layer 412 are similar to the steps of forming the N+1th metal layer 112 as shown in FIGS. 2C and 2D, except that the method for adjusting the thickness of the N+1th metal layer 412.

In the present embodiment, after adjustment, the adjusted N+1th expected thickness NP2' of the N+1th metal layer 412 is the sum of the N+1th expected thickness NP2 of the N+1th metal layer 412 and the Nth thickness error value NE1 of the Nth metal layer 102 (NP2'=NP2+NE1). The forming of the N+1th metal layer 412 includes steps of forming an ILD layer 413 on the Nth metal layer 102 to cover the Nth metal layer 102, and forming a plurality of recesses 414 and a plurality of vias 415 in the ILD layer 413 by at least one etching process, wherein the vias 415 are in communication with the recesses 414 to expose portions of the Nth metal layer 102.

As shown in FIG. 4A, each of the vias 415 is formed at the bottom of one of the recesses 414. The target depth D4 of the recesses 414 can be tuned by adjusting the thickness of the ILD layer 413, the depth of the etching process, and the target removal thickness H4 of the subsequent planarization process (such as a CMP process). Thereby, the target depth D4 of the recesses 414 can be substantially equal to the sum of the N+1th expected thickness NP2 of the N+1th metal layer 412, the Nth thickness error value NE1 of the Nth metal layer 102, and the target removal thickness H4 of the planarization process (D4=NP2+NE1+H4), which is equal to the sum of the adjusted N+1th expected thickness NP2' (NP2+NE1) of the N+1th metal layer 412 and the target removal thickness H4 of the planarization process (D4=NP2'+H4).

Afterwards, a metal deposition process is performed on the ILD layer 413 to form a metal material, such as copper, and fill the recesses 414 and the vias 415. Then, a planarization process is performed to remove a part of the metal material disposed above the ILD layer 413 and a part of the ILD layer 413, so as to form the N+1th metal layer 412 in the recess 414 and form a plurality of contact plugs 416 in the vias 415 by which electrically connect the Nth metal layer 102 and the N+1th metal layer 412 (as shown in FIG. 4B).

Subsequently, the steps as described in FIGS. 4A and 4B are repeated to form an N+2th metal layer (not shown) on the N+1th metal layer 412, and after performing a plurality of downstream-production processes (not shown), the MOMCAP 100 as shown in FIG. 2E can be formed.

Figure 5A:
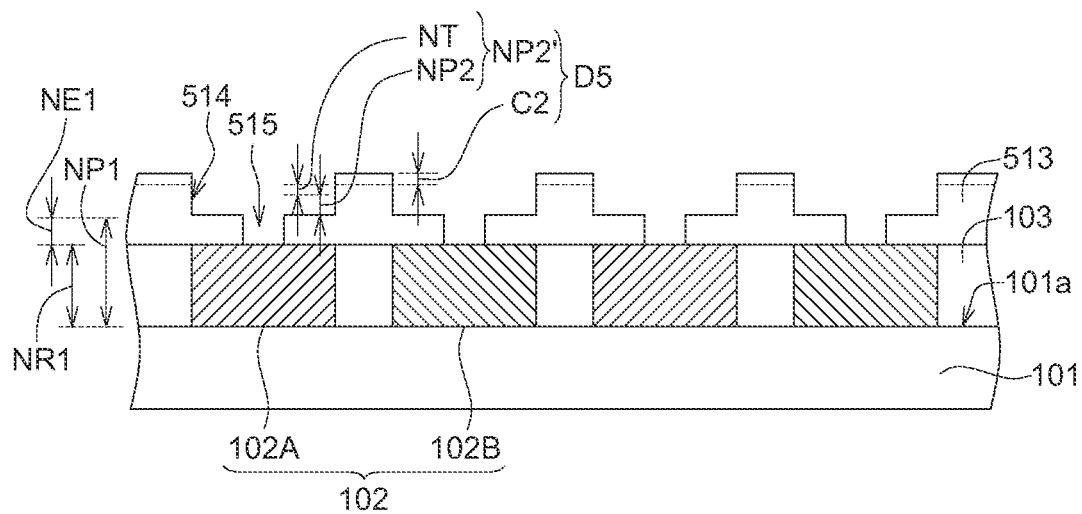
FIGS. 5A and 5B are cross-sectional views illustrating part of the processing structures for forming an N+1th metal layer over the Nth metal layer by applying the steps S13 and S14 as described in FIG. 1, in accordance with yet another embodiment of the present disclosure.
Figure 5B:
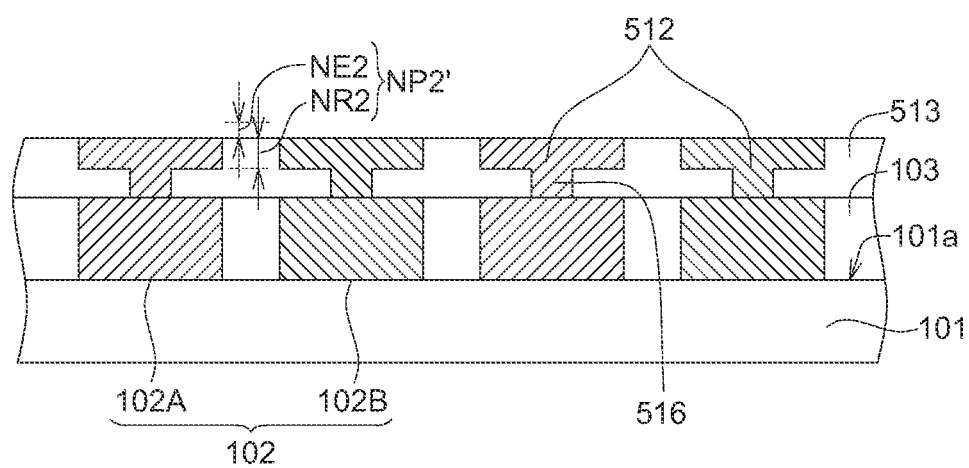

FIGS. 5A and 5B are cross-sectional views illustrating part of the processing structures for forming an N+1th metal layer 512 over the Nth metal layer 102 by applying the steps S13 and S14 as described in FIG. 1, in accordance with yet another embodiment of the present disclosure. In the present embodiment, the steps of forming the N+1th metal layer 512 are similar to the steps of forming the N+1th metal layer 412 as shown in FIGS. 4A and 4B, except that the method for adjusting the thickness of the N+1th metal layer 512.

In the present embodiment, the N+1th metal layer 512 has an N+1th thickness error tolerance value NT, which is smaller than the Nth thickness error value NE1 of the Nth metal layer 102. When the Nth thickness error value NE1 of the Nth metal layer 102 is substantially greater than the N+1th thickness error tolerance value NT of the N+1th metal layer 512, the N+1th expected thickness NP2 should be adjusted only based on the N+1th thickness error tolerance NT of the N+1th metal layer 512. As a result, the adjusted expected thickness NP2' of the N+1th metal layer 512 should be equal to the sum of the N+1th expected thickness NP2 and the thickness error tolerance value NT of the N+1th metal layer 512 (NP2'=NP2+NT), rather than the sum of the Nth thickness error value NE1 of the Nth metal layer 102 and the N+1th expected thickness NP2 of the N+1th metal layer 512, whereby the adjusted expected thickness NP2' is smaller than the sum of the Nth thickness error value NE1 and the N+1th expected thickness NP2 (NP2'<NE1+NP2).

In other words, the Nth thickness error value NE1 of the Nth metal layer 102 resulted from the process for fabricating the Nth metal layer 102 cannot be completely adjusted and compensated by the process of fabricating the N+1th metal layer 512. The remaining portion of the Nth thickness error value NE1 (i.e., the difference between the Nth thickness error value NE1 and the N+1th thickness error tolerance value NT (NE1−NT)) can be just adjusted and compensated by the subsequent process of preparing the N+2th metal layer 522.

In the present embodiment, the forming of the N+1th metal layer 512 includes steps of forming an ILD layer 513 on the Nth metal layer 102 to cover the Nth metal layer 102, and forming a plurality of recesses 514 and a plurality of vias 515 in the ILD layer 513 by at least one etching process, wherein the vias 515 are in communication with the recesses 514 to expose portions of the Nth metal layer 102.

As shown in FIG. 5A, the vias 515 are formed at the bottom of the recesses 514. The target depth D5 of the recesses 514 can be tuned by adjusting the depth of the etching process to make the target depth D5 of the recesses 514 substantially equal to the sum of the adjusted N+1th expected thickness NP2' (NP2'=NP2+NT) of the N+1th metal layer 512 and the tolerance thickness C2 of the ILD layer 513 that may be removed by the subsequent planarization process (D5=NT+NP2+C2). In other words, the result (D5−C2) of subtracting the tolerance thickness C2 of the ILD layer 513 from the target depth D5 of the recesses 514 is substantially equal to the adjusted N+1th expected thickness NP2' of the N+1th metal layer 512 ((D5−C2)=(NT+NP2)=NP2').

After that, a metal material, such as copper, is formed on the ILD layer 513 by a metal deposition process to fill the recesses 514 and the vias 515. Then, a planarization process is performed to remove a part of the metal material located above the ILD layer 513 (including removing the portion of the ILD layer 513 with the tolerance thickness C2 and the portion of the metal material corresponding to the tolerance thickness C2), so as to form the N+1th metal layer 512 in the recesses 514 and form the contact plugs 516 respectively disposed in the vias 515 by which electrically connect the Nth metal layer 102 with the N+1th metal layer 512 (as shown in FIG. 5B).

Figure 5C:
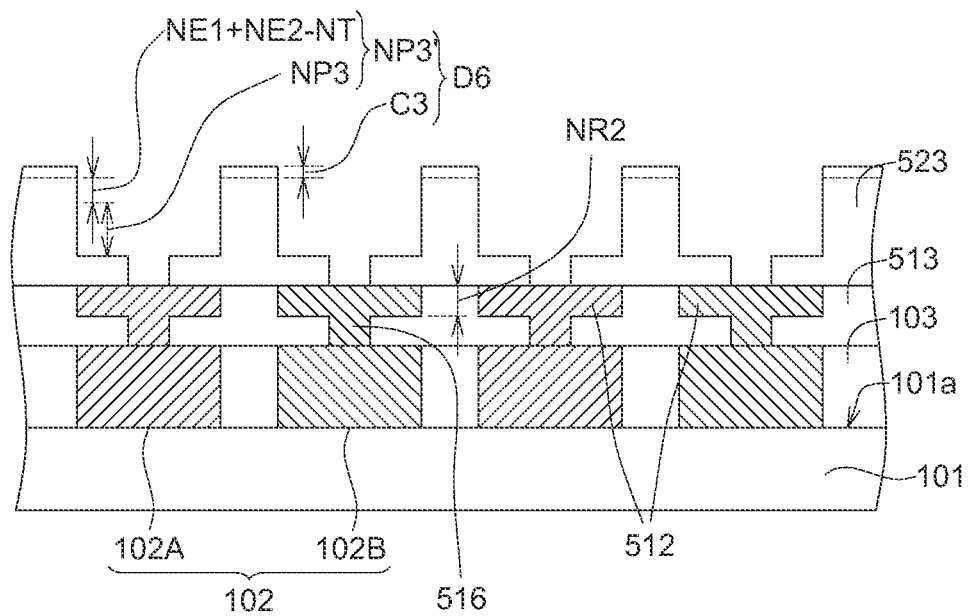
FIGS. 5C and 5D are cross-sectional views of illustrating part of the processing structures after an N+2th metal layer is formed over the N+1th metal layer by applying the steps S13 and S14 as described in FIG. 1, in accordance with further embodiment of the present disclosure.
Figure 5D:
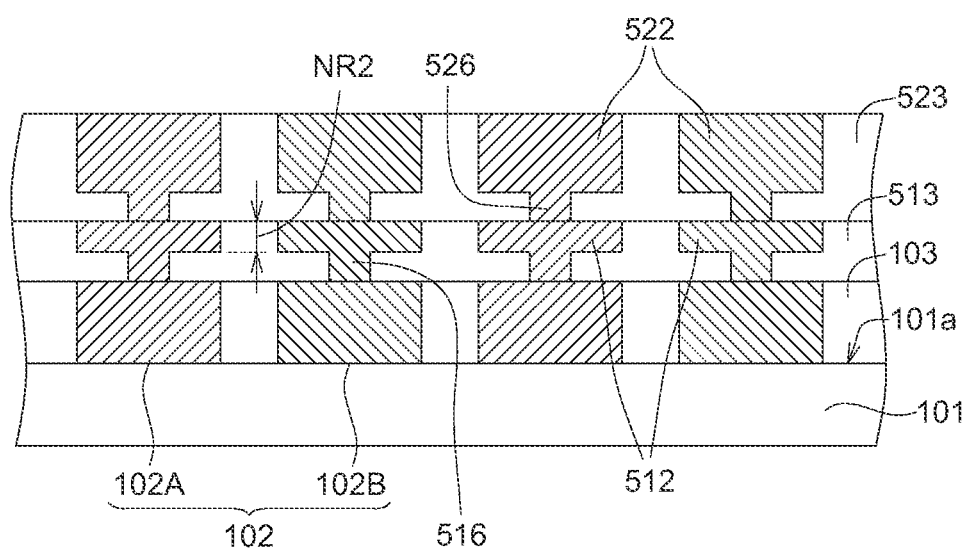

FIGS. 5C and 5D are cross-sectional views of illustrating part of the processing structures after an N+2th metal layer 522 is formed over the N+1th metal layer 512 by applying the steps S13 and S14 as described in FIG. 1, in accordance with further embodiment of the present disclosure.

Before forming the N+2th metal layer 522, the N+1th actual thickness NR2 of the N+1th metal layer 512 is obtained by performing an actual measurement to the actually made N+1th metal layer 512. And the N+1th error value NE2 of the of the N+1th metal layer 512 can be obtained by subtracting the N+1th adjusted expected thickness NP2' (NP2+NT) from the N+1th actual thickness NR2 of the N+1th metal layer 512 (which can be expressed as NE2=NR2−NP2'=NR2−NP2−NT).

During the process for fabricating the N+2th metal layer 522, the N+1th error value NE2 of the N+1th metal layer 512 and the remaining portion of the Nth thickness error value NE1 of the Nth metal layer 102 that has not been adjusted can be adjusted and compensated at the same time. That is, the N+2th expected thickness NP3 of the N+2th metal layer 522 can be adjusted according to a summed-up error value which is formed by summing up the N+1th thickness error value NE2 of the N+1th metal layer 512 and the difference between the Nth thickness error value NE1 of the Nth metal layer 102 and the N+1th thickness error tolerance value (NE1-NT) (the summed-up error value=NE2+NE1−NT). In the present embodiment, the adjusted N+2th expected thickness NP3' of the N+2th metal layer 522 can be equal to the sum of the N+2th expected thickness NP3 of the N+2th metal layer 522 and the summed-up error value (NP3'=NP3+NE2+NE1−NT).

The forming of the N+2th metal layer 522 includes steps of forming an ILD layer 523 on the N+1th metal layer 512 to cover the N+1th metal layer 512, and forming a plurality of recesses 524 and a plurality of vias 525 connected to the recesses 524 in the ILD layer 523 by at least one etching process, so that a part of the N+1th metal layer 512 can be exposed through the recesses 524 and the vias 525.

As shown in FIG. 5C, each of the vias 525 is formed at the bottom of one of the recesses 524. The target depth D6 of the recesses 524 can be tuned by adjusting the depth of the etching process to make the target depth D6 of the recesses 524 substantially equal to the sum of adjusted N+2th expected thickness NP3' of the N+2th metal layer 522 and the tolerance thickness C3 of the ILD layer 523 that may be removed by the subsequent planarization process (which can be expressed as D6=NP3'+C3). In other words, the result (D6−C3) of subtracting the tolerance thickness C3 of the ILD layer 523 from the target depth D6 of the recesses 524 is substantially equal to the adjusted N+2th expected thickness NP3' of the N+2th metal layer 522 (D6−C3=NP3'=NP3+NE2+NE1−NT).

Afterwards, a metal deposition process is performed on the ILD layer 523 to form a metal material, such as copper, and fill the recesses 524 and the vias 525. Then, a planarization process is performed to remove a part of the metal material disposed above the ILD layer 523 (including removing the portion of the ILD layer 523 with the tolerance thickness C6 and the portion of metal material corresponding to the tolerance thickness C6), so as to form the N+2th metal layer 522 in the recess 524 and form a plurality of contact plugs 526 respectively disposed in the vias 525 by which electrically connect the N+2th metal layer 522 with the N+1th metal layer 512 and (as shown in FIG. 5D). After performing a plurality of downstream-production processes (not shown), a MOMCAP similar to that as shown in FIG. 2E can be formed.

Figure 6A:
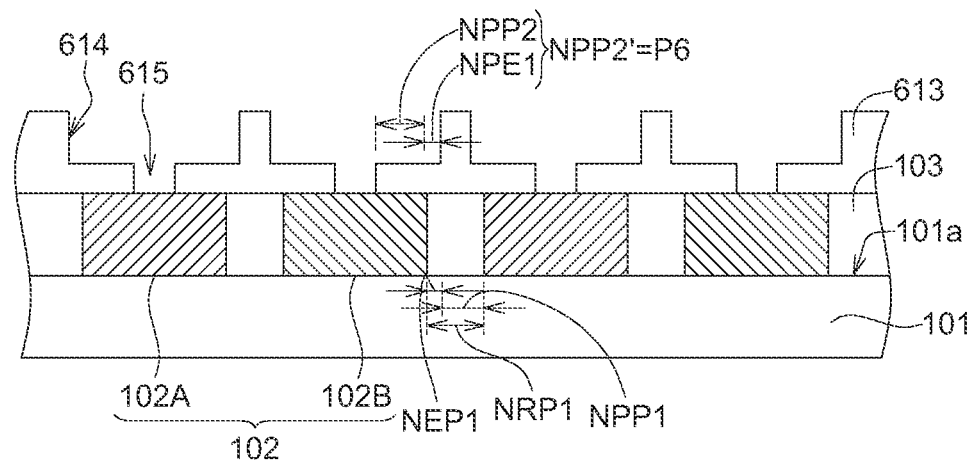
FIGS. 6A and 6B are cross-sectional views illustrating part of the processing structures after an N+1th metal layer is formed over the Nth metal layer by applying the steps S12 to S14 as described in FIG. 1, in accordance with yet another embodiment of the present disclosure.
Figure 6B:
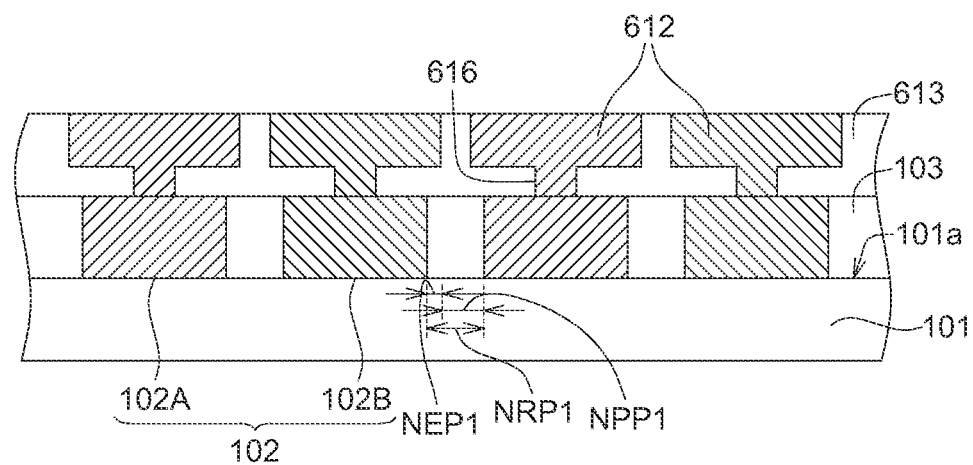

FIGS. 6A and 6B are cross-sectional views illustrating part of the processing structures after an N+1th metal layer 612 is formed over the Nth metal layer 102 by applying the steps S12 and S14 as described in FIG. 1, in accordance with yet another embodiment of the present disclosure. In the present embodiment, the N+1th actual capacitance value of the N+1th metal layer 612 in step S12 can be determined according to the expected capacitance value of the Nth metal layer 102, the N+1th metal layer 612 and the N+2th metal layer and an Nth actual pitch NRP1 of the Nth metal layer 102 actually measured.

In detail, because the expected capacitance value of each metal layers constituting the MOMCAP 100 is predetermined according to the element design of the MOMCAP 100; and it is known that the expected capacitance value of each metal layer is proportional to an expected pitch of the individual metal layer. Such that, the Nth actual capacitance value of the Nth metal layer 102 can be estimated according to the actually measured Nth actual pitch NRP1 of the Nth metal layer 102. And the Nth capacitance error value of the Nth metal layer 102 can be obtained by subtracting the estimated actual capacitance value from the Nth expected capacitance value of the Nth metal layer 102. In the present embodiment, the Nth capacitance error value of the Nth metal layer 102 resulted from the process for fabricating Nth metal layer 102 can be compensated by adjusting the N+1th expected pitch NPP2 of the N+1th metal layer 612.

The forming of the N+1th metal layer 612 includes steps of forming an ILD layer 613 on the Nth metal layer 102 to cover the Nth metal layer 102, and forming a plurality of recesses 614 and a plurality of vias 615 in the ILD layer 613 by an etching process, wherein the vias 615 are in communication with the recesses 614 to expose portions of the Nth metal layer 102. As shown in FIG. 6A, each of the vias 615 is formed at the bottom of one of the recesses 614. The target pitch P6 between two adjacent ones of the recesses 614 can be tuned by adjusting the opening width of the patterned photoresist (not shown) applied in the etching process for forming the recesses 614 to make the target pitch P6 substantially equal to the sum of the N+1th expected pitch NPP2 of the N+1th metal layer 612 and the Nth pitch error value NEP1 of the Nth metal layer 102 (P6=NPP2+NEP1), it is also substantially equal to the adjusted N+1th expected pitch NPP2' of the N+1th metal layer 612 (P6=NPP2'=NPP2+NEP1). The Nth pitch error value NEP1 of the Nth metal layer 102 can be the result of subtracting the Nth actual pitch NRP1 from the Nth expected pitch NPP1 of the Nth metal layer 102 (which can be expressed as NEP1=NPP1−NRP1).

After that, a metal material, such as copper, is formed on the ILD layer 613 by a metal deposition process to fill the recesses 614 and the vias 615. Then, a planarization process is performed to remove a part of the metal material located above the ILD layer 613, so as to form the N+1th metal layer 612 in the recesses 614 and form the contact plugs 616 respectively disposed in the vias 615 by which electrically connect the Nth metal layer 102 with the N+1th metal layer 612 (as shown in FIG. 6B).

Subsequently, an N+2th metal layer (not shown) can be formed on the N+1th metal layer 612 by repeating the steps as described in FIGS. 6A and 6B. And after performing a plurality of downstream-production processes (not shown), a MOMCAP similar to that as shown in FIG. 2E can be formed.

In accordance with the aforementioned embodiments of the present disclosure, a method for fabricating a MOMCAP is provided; wherein the method includes steps of forming at least N+1 metal layers on a substrate, where N is an integer greater than 1. Among the process of manufacturing these metal layers, at least one process parameter for forming an Nth metal layer, such as an Nth capacitance error value, an Nth thickness error value and/or an Nth pitch error value of the Nth metal layer, is estimated, and the process parameters of an N+1th metal layer subsequently being formed on the Nth metal layer can be adjusted according to the at least one estimated parameter to make the sum of an Nth actual capacitance value of the Nth metal layer and the N+1th actual capacitance value of the N+1th metal layer equal to the sum of an Nth expected capacitance value of the Nth metal layer and an N+1th expected capacitance value of the N+1th metal layer. As a result, the variation of the overall capacitance of the MOMCAP can be greatly reduced, and the yield of the device can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a metal-oxide-metal capacitor (MOMCAP), comprising:
   calculating an Nth expected pitch of an Nth metal layer and an N+1th expected pitch of an N+1th metal layer according to an Nth expected capacitance value of the Nth metal layer;
   forming the Nth metal layer on a substrate according to the Nth expected capacitance value and the Nth expected pitch of the Nth metal layer;
   calculating an Nth capacitance error value between an Nth actual capacitance value of the Nth metal layer and the Nth expected capacitance value;
   calculating an Nth pitch error value between an actual pitch of the Nth metal layer and the Nth expected pitch;
   adjusting an N+1th expected capacitance value of an N+1th metal layer to form an adjusted N+1th expected capacitance value according to the Nth capacitance error value;
   adjusting the N+1th expected pitch according to the Nth pitch error value; and
   forming the N+1th metal layer with an N+1th actual capacitance value on the Nth metal layer according to the adjusted N+1th expected capacitance value, so as to make a sum of the Nth actual capacitance value and the N+1th actual capacitance value substantially equal to a sum of the Nth expected capacitance value and the N+1th expected capacitance value, wherein, N is an integer greater than 1.

2. A method for fabricating a MOMCAP, comprising:
   calculating an Nth expected thickness of an Nth metal layer and an N+1th expected thickness of an N+1th metal layer according to an Nth expected capacitance value of the Nth metal layer;
   forming the Nth metal layer on the substrate according to the Nth expected thickness;
   calculating an Nth thickness error value between an Nth actual thickness of the Nth metal layer and the Nth expected thickness;
   adjusting the N+1th expected thickness according to the Nth thickness error value to form an adjusted N+1th expected thickness of the N+1th metal layer; and
   forming the N+1th metal layer with an N+1th actual thickness on the Nth metal layer according to the adjusted N+1th expected thickness, so as to make a sum of the Nth actual thickness and the N+1th actual thickness substantially equal to a sum of the Nth expected thickness and the N+1th expected thickness;
   wherein the step of forming the N+1th metal layer with the N+1th actual thickness comprises:
   forming a dielectric layer on the Nth metal layer;
   forming at least one recess in the dielectric layer;
   forming a metal material layer on the dielectric layer and filling the at least one recess;
   performing a planarization process with a removal thickness that is equal to a target removal thickness of the planarization process subtracting the Nth thickness error value; and
   adjusting a thickness of the dielectric layer according to the Nth thickness error value and the target removal thickness.

3. The method according to claim 2, wherein the N+1th metal layer has a N+1th thickness error tolerance value; when the Nth thickness error value is greater than the N+1th thickness error tolerance value, the N+1th expected thickness is adjusted only based on the N+1th thickness error tolerance value.

4. The method according to claim 3, further comprising:
   adjusting N+2th expected thickness of an N+2th metal layer to form an adjusted N+2th expected thickness according to a summed-up error value which is formed by summing up a N+1th thickness error value of the N+1th metal layer and a difference between the Nth thickness error value and the N+1th thickness error tolerance value; and
   forming the N+2th metal layer on the N+1th metal layer according to the adjusted N+2th expected thickness.

5. The method according to claim 2, wherein the MOMCAP has a plurality of metal layers and an overall expected thickness which is a sum of a plurality of expected thicknesses of the plurality of metal layers; and the overall expected thickness is proportional to an overall capacitance value of the MOMCAP.

6. The method according to claim 5, wherein a cumulative thickness and a cumulative capacitance value measured between the substrate and the Nth metal layer form a linear relationship function; and a slope of the linear relationship function is identical to a ratio of the overall expected thickness to the overall capacitance value.

7. A method for fabricating a MOMCAP, comprising:
   calculating an Nth expected thickness of an Nth metal layer and an N+1th expected thickness of an N+1th metal layer according to an Nth expected capacitance value of the Nth metal layer;

forming the Nth metal layer on the substrate according to the Nth expected thickness;

calculating an Nth thickness error value between an Nth actual thickness of the Nth metal layer and the Nth expected thickness;

adjusting the N+1th expected thickness according to the Nth thickness error value to form an adjusted N+1th expected thickness of the N+1th metal layer; and forming the N+1th metal layer with an N+1th actual thickness on the Nth metal layer according to the adjusted N+1th expected thickness, so as to make a sum of the Nth actual thickness and the N+1th actual thickness substantially equal to a sum of the Nth expected thickness and the N+1th expected thickness;

wherein the step of forming the N+1th metal layer with the N+1th actual thickness comprises:

forming a dielectric layer on the Nth metal layer;

forming at least one recess in the dielectric layer with a depth that is equal to a target depth of the at least one recess plus the Nth thickness error value;

forming a metal material layer on the dielectric layer and filling the at least one recess; and performing a planarization process.

8. The method according to claim 7, further comprising adjusting a thickness of the dielectric layer according to the Nth thickness error value and the target depth.

\* \* \* \* \*